United States Patent
Hsu

(10) Patent No.: US 8,420,937 B2
(45) Date of Patent: Apr. 16, 2013

(54) ENCLOSURE OF OUTDOOR APPARATUS

(75) Inventor: Shih-Chang Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 317 days.

(21) Appl. No.: 12/884,199

(22) Filed: Sep. 17, 2010

(65) Prior Publication Data

US 2011/0259890 A1    Oct. 27, 2011

(30) Foreign Application Priority Data

Apr. 26, 2010 (CN) .................. 2010 2 0169343 U

(51) Int. Cl.
*H02G 15/08* (2006.01)
(52) U.S. Cl.
USPC ............................................................ 174/91
(58) Field of Classification Search .................. 174/91, 174/92
See application file for complete search history.

(56) References Cited

U.S. PATENT DOCUMENTS

| | | | | |
|---|---|---|---|---|
| 3,395,382 | A * | 7/1968 | Weagant | 439/523 |
| 3,710,003 | A * | 1/1973 | Channell | 174/37 |
| 4,684,764 | A * | 8/1987 | Luzzi et al. | 174/91 |
| 6,025,561 | A * | 2/2000 | Dams | 174/91 |

* cited by examiner

*Primary Examiner* — Chau Nguyen
(74) *Attorney, Agent, or Firm* — Altis Law Group, Inc.

(57) ABSTRACT

An enclosure of an outdoor apparatus includes a first case, a second case and a gasket ring sealed between the first case and the second case. The first case includes a first cover and a flange portion extending from the first cover outwardly. The first case defines a first open surrounded by the flange portion. The flange portion defines a latching groove towards the first open. The second case includes a second cover and a stopper portion extending from the second cover outwardly. The stopper portion is received in the first open and matches with the flange portion. The cover defines a second open surrounded by the stopper portion and opposite to the first open. The stopper portion includes a latch portion protruded outwardly from the stopper portion to engage with the latching groove.

5 Claims, 5 Drawing Sheets

ENCLOSURE OF OUTDOOR APPARATUS

BACKGROUND

1. Technical Field

The present disclosure relates to an outdoor apparatus, and more particularly to a waterproof enclosure of an outdoor apparatus.

2. Description of Related Art

There are many outdoor communication equipments in use, such as base stations. Basic performance and waterproofing of the outdoor communication equipment must be ensured. Generally, an enclosure of the outdoor communication equipment comprises a cover, an enclosure body and a plane gasket ring. The plane gasket ring is disposed between the cover and the enclosure body. Thus, the enclosure only can partially inhibit entry of water into the enclosure.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
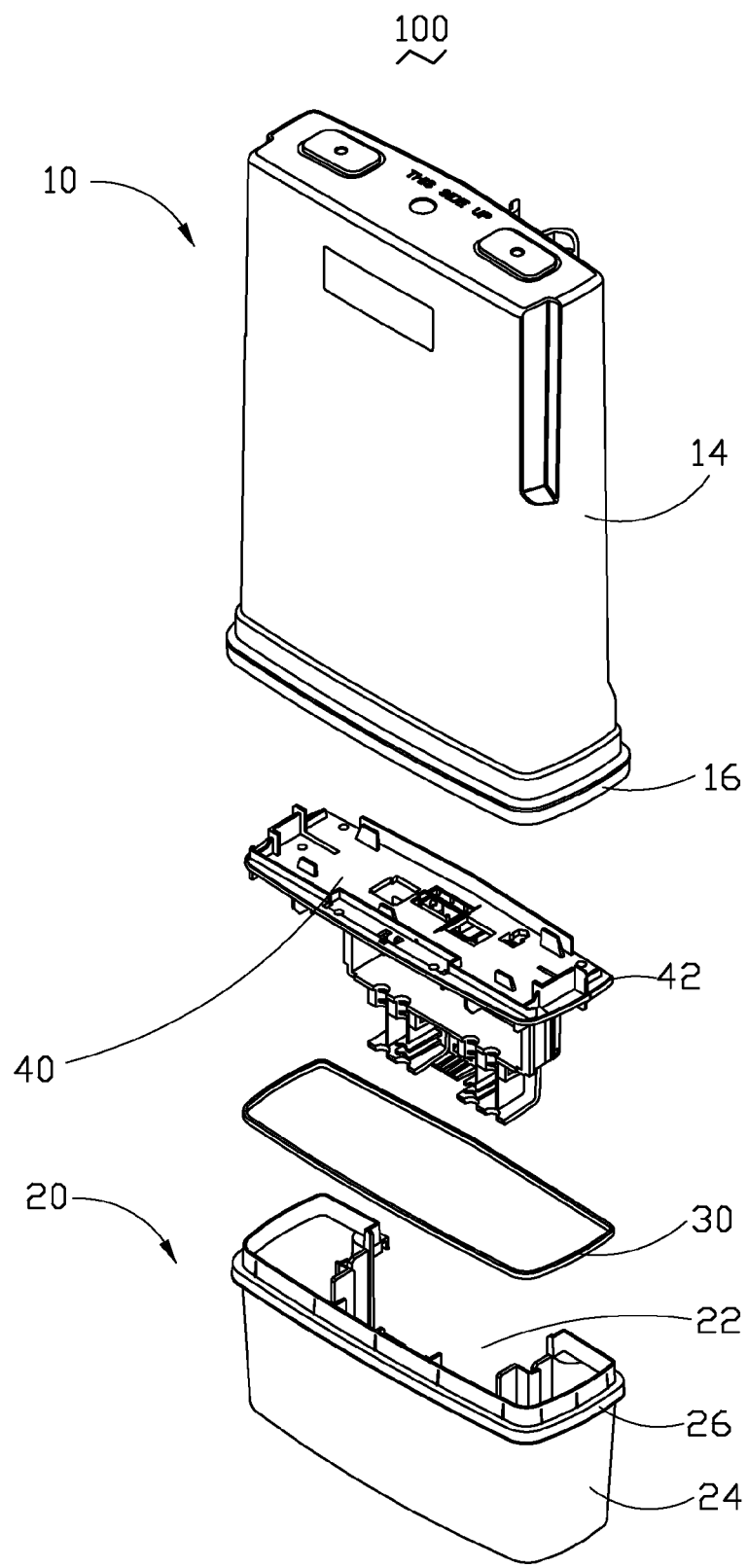
FIG. 1 is a disassembled perspective view of one embodiment of an enclosure of an outdoor apparatus in accordance with the present disclosure.
Figure 2:
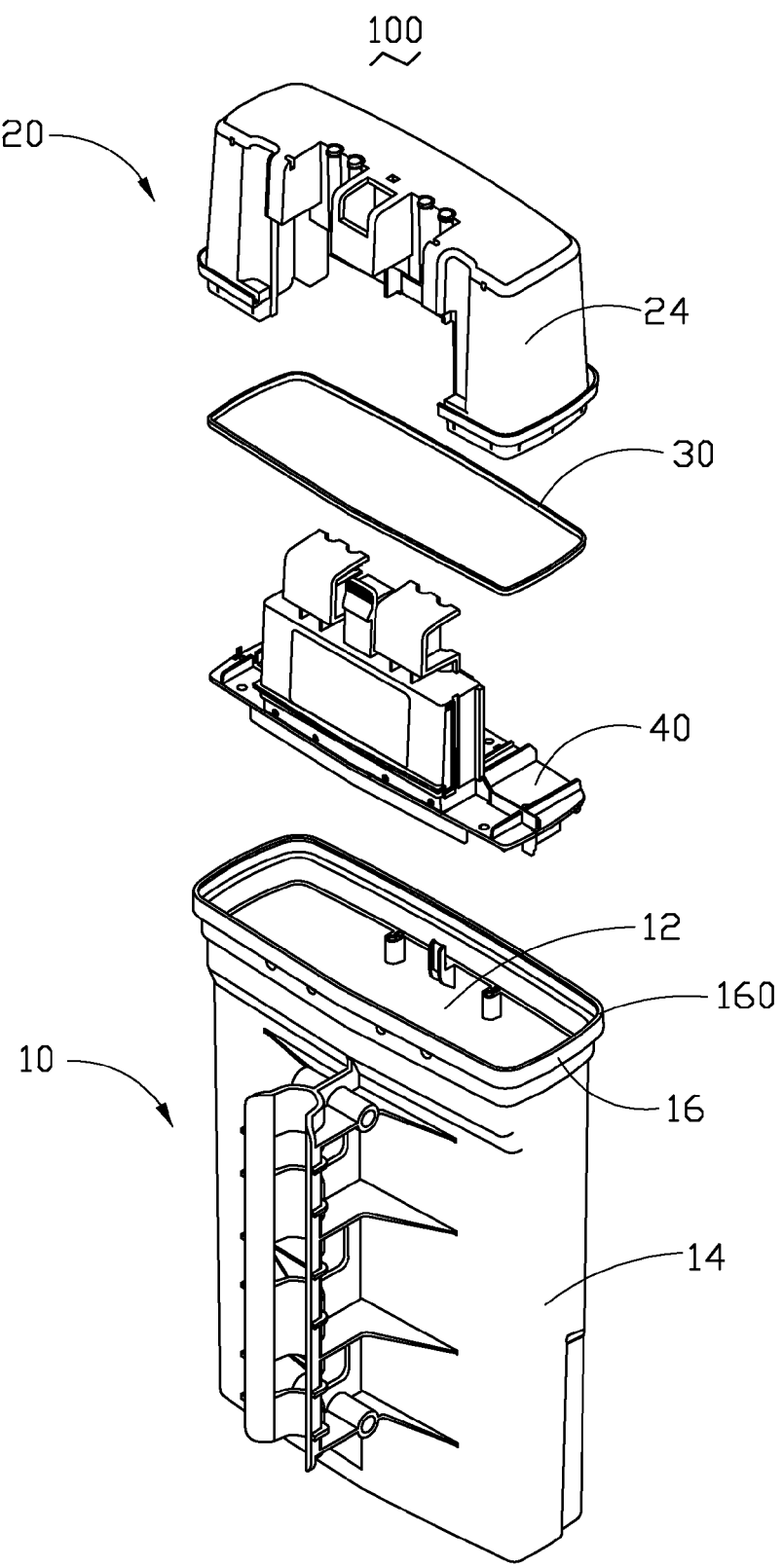
FIG. 2 is another disassembled perspective view of the embodiment of the enclosure of the outdoor apparatus in accordance with the present disclosure.
Figure 3:
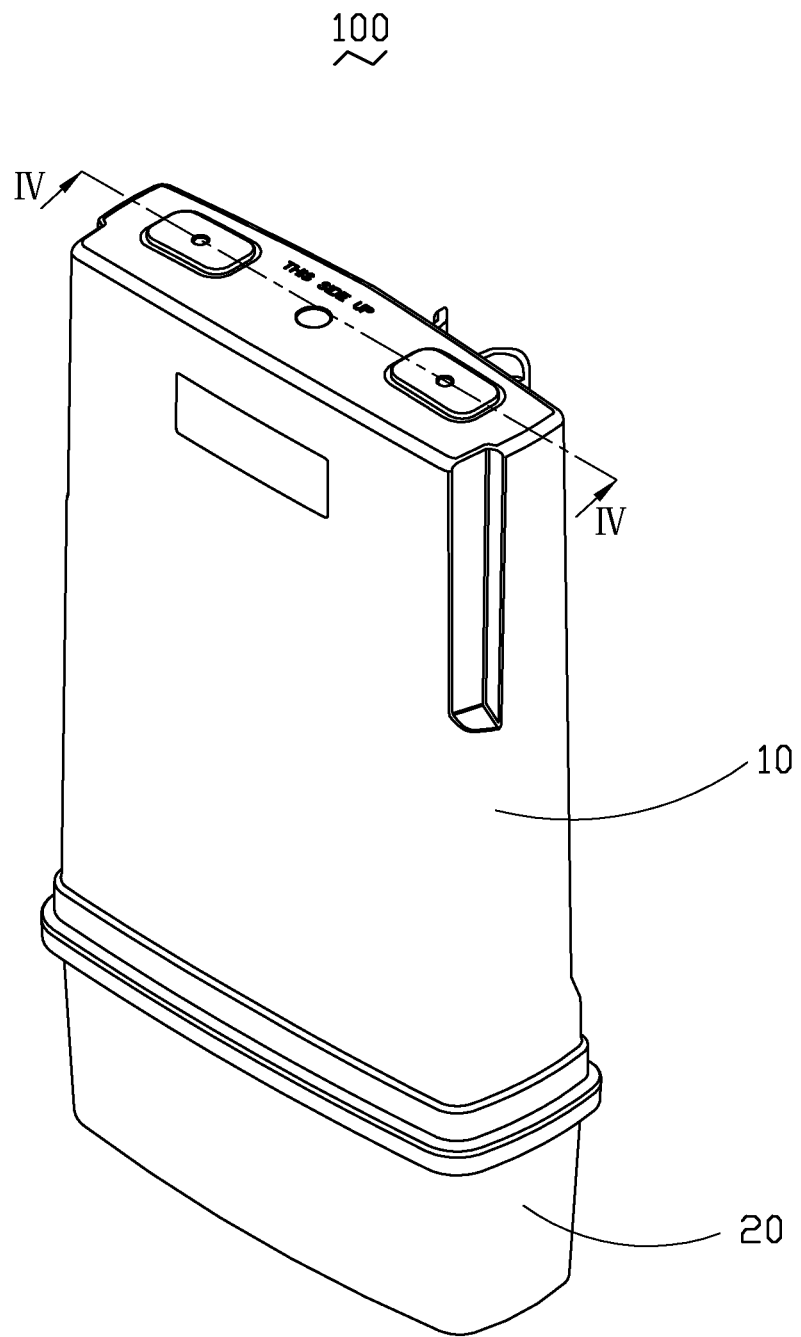
FIG. 3 is a perspective view of the embodiment of the enclosure of the outdoor apparatus shown in FIG. 1.
Figure 4:
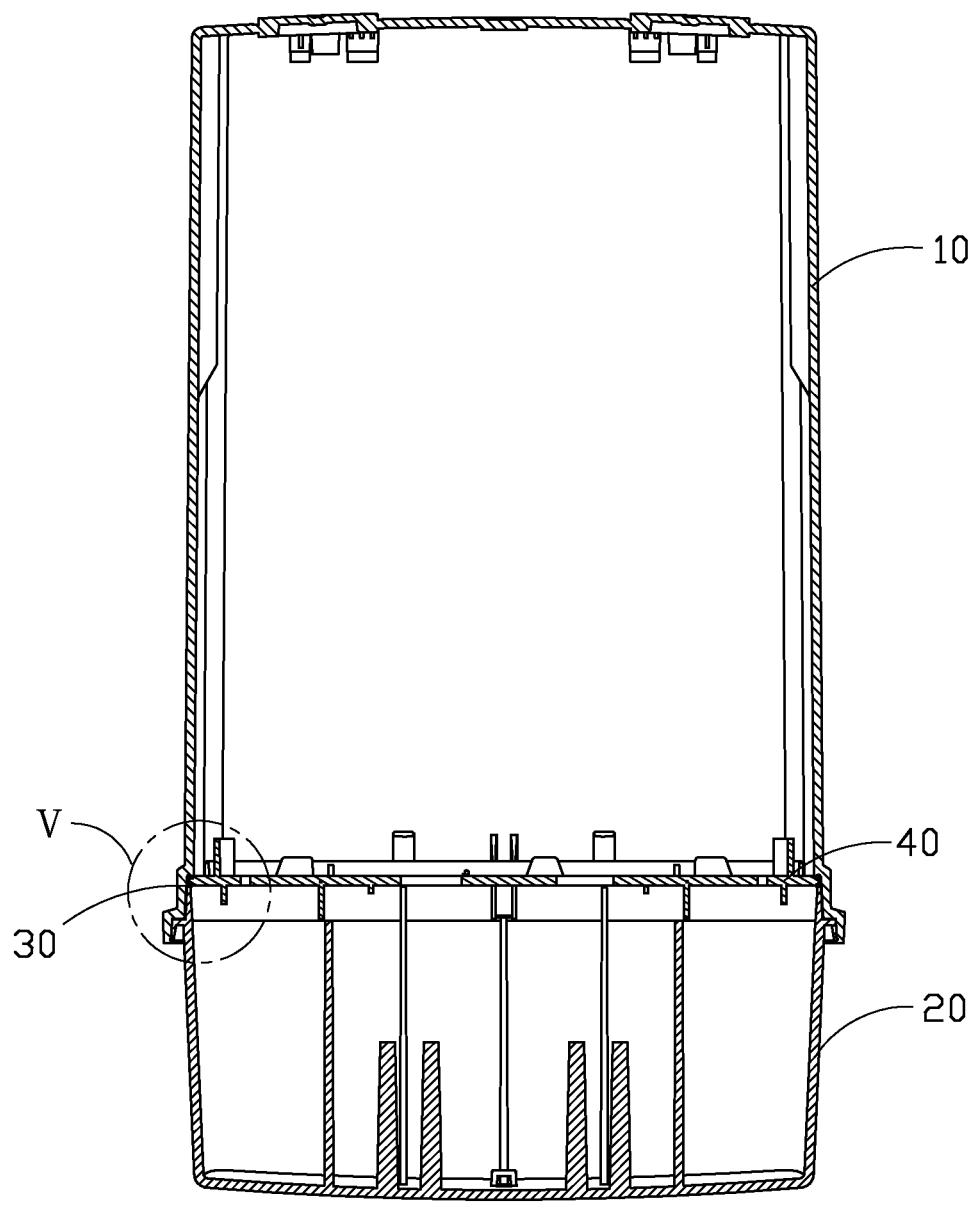
FIG. 4 is a cross-sectional view of the embodiment taken along line IV-IV of FIG. 3.

Referring to FIG. 1 and FIG. 2, an enclosure 100 of an outdoor apparatus comprises a first case 10, a second case 20, a gasket ring 30 and a base substrate 40. The gasket ring 30 is sealed between the first case 10 and the second case 20.

The enclosure 100 has a hollow substantially rectangular shape. The enclosure 100 can receive and secure electronic modules, such as circuit boards and antenna modules. In the illustrated embodiment, the electronic modules are received in the first case 10 of the enclosure 100.

Figure 5:
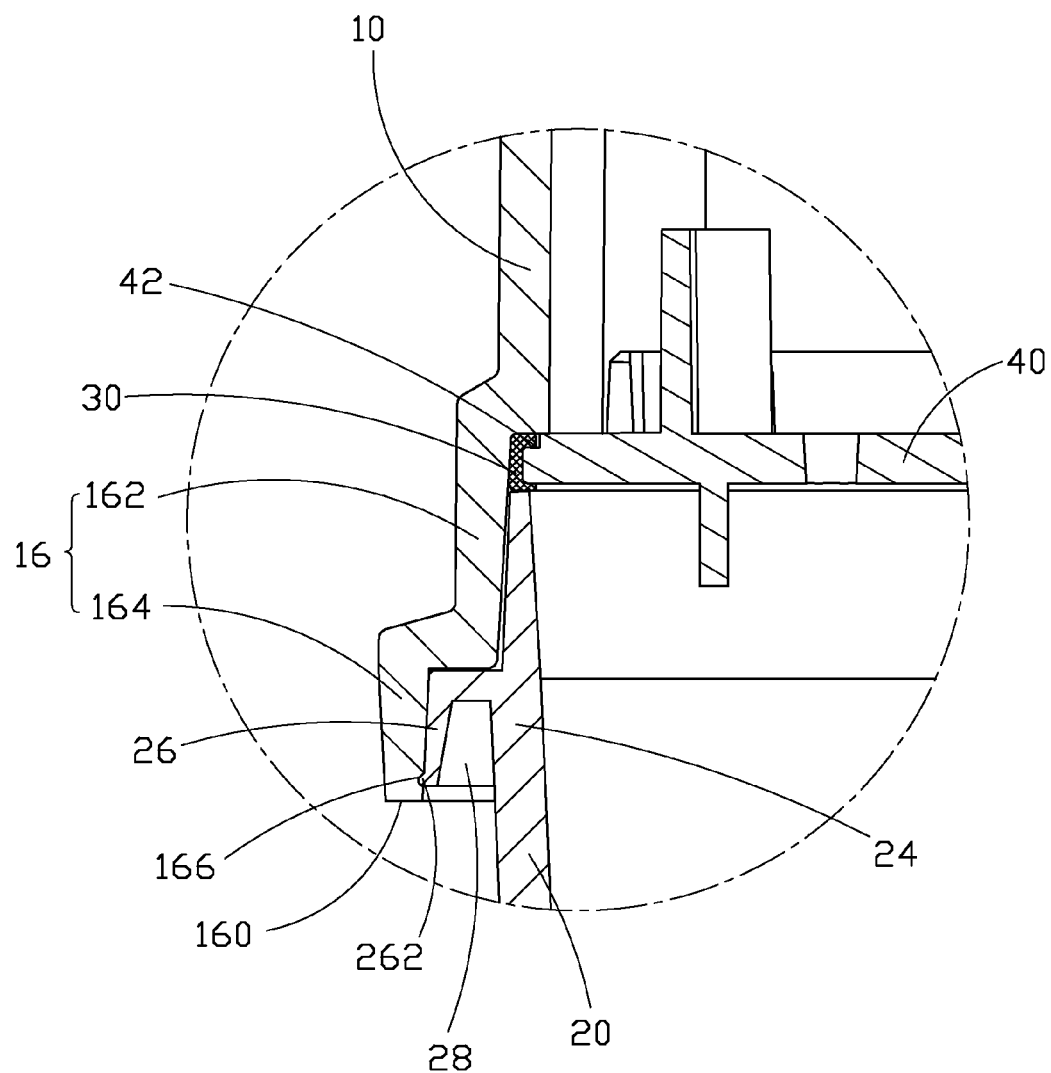
FIG. 5 is a partially enlarged sectional view of the embodiment taken along V of FIG. 4.

The first case 10 comprises a first cover 14 and a flange portion 16 extending from edges of the first cover 14 outwardly. The first cover 14 defines a first open 12 surrounded by the flange portion 16 so as to form a hollow housing for the first case 10. In the illustrated embodiment, the flange portion 16 is integrally formed with the first cover 14 and is configured with a cross section of an approximately Z-shape. Referring to FIG. 5, the flange portion 16 comprises an end portion 160, a first flange portion 162 and a second flange portion 164 ended at the end portion 160. The first flange portion 162 is located between the first cover 14 and the second flange portion 164. In this embodiment, closing to the end portion 160, the flange portion 16 defines a latching groove 166 towards the first open 12.

The second case 20 comprises a second cover 24 and a stopper portion 26 extending from the second cover 24 outwardly. The stopper portion 26 is received in the first open 12 and matches with the flange portion 16. The second case 20 defines a second open 22 surrounded by the stopper portion 26 and opposite to the first open 12. In the illustrated embodiment, the second open 22 is covered by the base substrate 40. In the illustrated embodiment, the stopper portion 26 is integrally formed with the second cover 24. Referring to FIG. 5, the second case 20 defines a groove 28 located between the second cover 24 and the stopper portion 26 to improve elastic performance of the stopper portion 26. In the illustrated embodiment, the groove 28 is substantially in an "n" shape. The stopper portion 26 comprises a latch portion 262. The latch portion 262 is protruded outwardly from the stopper portion 26 and engages with the latching groove 166 to secure the first case 10 onto the second case 20. In the embodiment, the engagement of the latch portion 262 and the latching groove 166 also inhibits water entry.

The gasket ring 30 is disposed between the first case 10 and the second case 20. In the illustrated embodiment, the cross section of the gasket ring 30 is approximately C-shaped.

The base substrate 40 is latched on the second case 20 to assemble circuit boards or other electronic models (not shown). In the illustrated embodiment, the base substrate 40 is independent from the second case 20. In the other illustrated embodiment, the base substrate 40 is integrally formed with the second case 20. The base substrate 40 defines a sealing slot 42. The sealing slot 42 is used to receive the gasket ring 30 to inhibit water entering into the enclosure 100 and to protect the electronic modules in the enclosure 100. The sealing slot 42 is disposed between the flange portion 16 and the second case 20 in assembly.

Referring to FIG. 5, in assembly, the base substrate 40 is mounted on the second case 20, with the gasket ring 30 configured therebetween. Subsequently, the first open 12 is fastened to the second open 22, as well as the gasket ring 30 is also disposed between the base substrate 40 and the sealing slot 42 of the first case 10. The latching portion 262 is received in latching groove 166 to securely mount the first case 10 onto the second case 20 and to inhibit entry of water. The gasket ring 30 is filled in the sealing slot 42 by firmly mounting the flange portion 16 with the gasket ring 30, and the flange portion 16 completely wraps the gasket ring 30 to inhibit water from pouring on the gasket ring 30 directly and to inhibit water entering into the enclosure 100, for example, with capillary phenomenon.

When using, the flange portion 16 inhibits water entering into enclosure 100 from the first case 10 and leads the water flowing from the outer surface of the enclosure 100.

When water is spattered onto the second case 20, the stopper portion 26 changes the flowing direction of water and stops the water entering into the enclosure 100.

The latch portion 262 is resisted in the latching groove 166 to inhibit water from entering into enclosure 100 via assembling gaps between and the first case 10 and the second case 20. The enclosure 100 has double waterproof function by using gasket ring 30 and by engaging the flange portion 16 with the stopper portion 26.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An enclosure of an outdoor apparatus, comprising:
   a first case, comprising a first cover and a flange portion extending from the first cover outwardly, the first case defining a first open surrounded by the flange portion, the flange portion defining a latching groove towards the first open;
   a second case, comprising a second cover and a stopper portion extending from the second cover outwardly, the stopper portion received in the first open and matching with the flange portion and comprising a latch portion used to engage with the latching groove, the second case defining a second open surrounded by the stopper portion and opposite to the first open;
   a gasket ring, sealed between the first case and the second case; and
   a base substrate latched on the second case and covering the second open, wherein the base substrate defines a sealing slot used to receive the gasket ring, the sealing slot is disposed between the flange portion and the second case, and the cross section of the gasket ring is approximately C-shaped.

2. The enclosure as claimed in claim 1, wherein the flange portion is configured with a cross section of approximately a Z-shape.

3. The enclosure as claimed in claim 2, wherein the flange portion comprises an end portion, a first flange portion,, and a second flange portion ended at the end portion, and the first flange portion is located between the first cover and the second flange portion.

4. The enclosure as claimed in claim 1, wherein the second case defines a groove located between the second cover and the stopper portion to improve elastic performance of the stopper portion.

5. The enclosure as claimed in claim 4, wherein the groove is substantially in an "n" shape.

* * * * *